(12) United States Patent
Sawada et al.

(10) Patent No.: US 8,044,128 B2
(45) Date of Patent: Oct. 25, 2011

(54) WHITE HEAT-CURABLE SILICONE/EPOXY HYBRID RESIN COMPOSITION FOR OPTOELECTRONIC USE, MAKING METHOD, PREMOLDED PACKAGE, AND LED DEVICE

(75) Inventors: Junichi Sawada, Annaka (JP); Yusuke Taguchi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/872,510

(22) Filed: Aug. 31, 2010

(65) Prior Publication Data
US 2011/0054072 A1 Mar. 3, 2011

(30) Foreign Application Priority Data
Sep. 1, 2009 (JP) ................................. 2009-201559

(51) Int. Cl.
*C08K 5/524* (2006.01)
(52) U.S. Cl. ....................................... 524/147; 524/151
(58) Field of Classification Search .................. 524/147, 524/151, 153
See application file for complete search history.

(56) References Cited

U.S. PATENT DOCUMENTS

| 7,527,991 | B2 | 5/2009 | Sato et al. | |
|---|---|---|---|---|
| 2006/0035092 | A1 | 2/2006 | Shimizu et al. | |
| 2008/0187762 | A1* | 8/2008 | Hayashi et al. | 428/413 |
| 2008/0255283 | A1* | 10/2008 | Aoki et al. | 524/300 |
| 2010/0155739 | A1* | 6/2010 | Kuramoto et al. | 257/76 |

FOREIGN PATENT DOCUMENTS

| EP | 1914811 | A1 | 4/2008 |
|---|---|---|---|
| EP | 2135898 | A1 | 12/2009 |
| EP | 2141201 | A1 | 1/2010 |
| JP | 2656336 | B2 | 9/1997 |
| JP | 2000-196151 | A | 7/2000 |
| JP | 2003-224305 | A | 8/2003 |
| JP | 2005-306952 | A | 11/2005 |
| JP | 2006-77234 | A | 3/2006 |

* cited by examiner

*Primary Examiner* — Peter Szekely
(74) *Attorney, Agent, or Firm* — Birch, Stewart, Kolasch & Birch, LLP (57) ABSTRACT

A white heat-curable silicone/epoxy hybrid resin composition is provided comprising (A) a heat-curable silicone resin, (B) a triazine derived epoxy resin composition, (C) a white pigment, (D) an inorganic filler, and (E) an antioxidant. Antioxidant (E) is a phosphite compound having formula: $P(OR^1)(OR^2)_2$ wherein $R^1$ and $R^2$ are organic groups of at least 6 carbon atoms. Components (A) and (B) are present in a weight ratio of from 5:95 to 95:5. The composition effectively cures into a product maintaining heat resistance, light resistance and improved strength over a long term.

14 Claims, 1 Drawing Sheet

WHITE HEAT-CURABLE SILICONE/EPOXY HYBRID RESIN COMPOSITION FOR OPTOELECTRONIC USE, MAKING METHOD, PREMOLDED PACKAGE, AND LED DEVICE

CROSS-REFERENCE TO RELATED APPLICATION

This non-provisional application claims priority under 35 U.S.C. §119(a) on Patent Application No. 2009-201559 filed in Japan on Sep. 1, 2009, the entire contents of which are hereby incorporated by reference.

TECHNICAL FIELD

This invention relates to white heat-curable silicone/epoxy hybrid resin compositions for optoelectronic devices, curing into parts having whiteness, heat resistance, light resistance and improved strength, a method for preparing the same, premolded packages for receiving light emitting diodes (LED) comprising the compositions in the cured state, and LED devices.

BACKGROUND ART

Optical semiconductor parts such as LED have many advantages including small size, efficiency, vivid color emission, elimination of bulb failure, excellent drive characteristics, resistance to vibration, and resistance to repeated turn-on and off. These parts are thus often utilized as various indicators and light sources. Optoelectronic devices using optical semiconductor parts are mounted on substrates, which are now typically made of polyphthalamide (PPA) resins.

The current rapid advance of the optoelectronic technology has brought about photo-semiconductor devices of increased output and shorter wavelength. Photo-semiconductor devices are often encapsulated or mounted using prior art PPA resins as colorless or white material. However, these encapsulants and substrates are substantially degraded during long-term service and susceptible to visible color shading, separation and a lowering of mechanical strength. It is desired to overcome these problems effectively.

More particularly, JP 2656336 discloses that an optoelectronic device is encapsulated with a B-staged epoxy resin composition, in the cured state, comprising an epoxy resin, a curing agent, and a curing promoter, the components being uniformly mixed on a molecular level. As to the epoxy resin, it is described that bisphenol A epoxy resins or bisphenol F epoxy resins are mainly used although triglycidyl isocyanate and the like may also be used. In examples, a minor amount of triglycidyl isocyanate is added to the bisphenol A or F epoxy resin. The present inventors have empirically found that this B-staged epoxy resin composition for semiconductor encapsulation tends to yellow when held at high temperatures for a long period of time.

Triazine derivative epoxy resins are used in LED-encapsulating epoxy resin compositions as disclosed in JP-A 2000-196151, JP-A 2003-224305, and JP-A 2005-306952. None of these patents succeed in solving the problem of yellowing during long-term service at high temperature.

JP-A 2006-077234 describes a LED-encapsulating resin composition comprising an organopolysiloxane having a weight average molecular weight of at least 5×10³ and a condensation catalyst. Since this organopolysiloxane must be transparent and liquid at room temperature, the composition does not lend itself to transfer molding and compression molding.

Citation List
Patent Document 1: JP 2656336
Patent Document 2: JP-A 2000-196151
Patent Document 3: JP-A 2003-224305
Patent Document 4: JP-A 2005-306952
Patent Document 5: JP-A 2006-077234

SUMMARY OF INVENTION

An object of the invention is to provide a white heat-curable silicone/epoxy hybrid resin composition for optoelectronic devices, which is successful in improving the strength of silicone resins by virtue of a silicone resin/epoxy resin hybrid material and which cures into a uniform product maintaining heat resistance and light resistance and experiencing least yellowing over a long period of time. Another object of the invention is to provide a method for preparing the composition, a LED-receiving premolded package comprising the composition in the cured state, and an LED device.

The inventors have found that a white heat-curable silicone/epoxy hybrid resin composition comprising a heat-curable silicone resin, a triazine derived epoxy resin composition, a white pigment, an inorganic filler (excluding the white pigment), a curing promoter, and a specific antioxidant can be effectively cured into a product having heat resistance, light resistance and improved strength and is thus suited for optoelectronic use.

In a first aspect, the invention provides a white heat-curable silicone/epoxy hybrid resin composition for optoelectronic devices, comprising (A) a heat-curable silicone resin, (B) a triazine derived epoxy resin composition, (C) a white pigment, (D) an inorganic filler excluding the white pigment, and (E) an antioxidant. The antioxidant (E) is a phosphite compound having the general formula (1):

$$P(OR^1)(OR^2)_2 \qquad (1)$$

wherein $R^1$ and $R^2$ are each independently an organic group of at least 6 carbon atoms. Components (A) and (B) are present in a weight ratio of from 5:95 to 95:5.

Preferably, in formula (1), either one or all of $R^1$ and $R^2$ are alkyl groups of at least 6 carbon atoms.

In a preferred embodiment, the heat-curable silicone resin (A) has the average compositional formula (2):

$$R^3{}_a Si(OR^4)_b(OH)_c O_{(4-a-b-c)/2} \qquad (2)$$

wherein $R^3$ is each independently an organic group of 1 to 20 carbon atoms, $R^4$ is each independently an organic group of 1 to 4 carbon atoms, a, b and c are numbers in the range: $0.8 \leq a \leq 1.5$, $0 \leq b \leq 0.3$, $0.001 \leq c \leq 0.5$, and $0.801 \leq a+b+c < 2$.

In a preferred embodiment, the triazine derived epoxy resin composition (B) comprises (B-1) a triazine derived epoxy resin and (B-2) an acid anhydride. In a more preferred embodiment, the triazine derived epoxy resin composition (B) is obtained by combining (B-1) a triazine derived epoxy resin with (B-2) an acid anhydride in such amounts as to provide an epoxy group equivalent to acid anhydride group equivalent ratio between 0.6 and 2.0, reacting them to form a solid product, and grinding the solid product.

In a preferred embodiment, the white pigment (C) is one or more members selected from the group consisting of titanium dioxide having an average particle size of 0.05 to 5.0 μm, and potassium titanate, zirconium oxide, zinc sulfide, zinc oxide, alumina and magnesium oxide each having an average particle size of 0.1 to 3.0 μm, and the inorganic filler (D) is one or more members selected from the group consisting of silica, alumina, magnesium oxide, aluminum hydroxide, zinc oxide, silicon nitride, aluminum nitride, and boron nitride each having an average particle size of 4 to 50 μm.

In a preferred embodiment, the white pigment (C) and the inorganic filler (D) are present in a total amount of 50 to 95% by weight of the overall composition, the white pigment (C) is present in an amount of 5 to 40% by weight of the overall composition, and the inorganic filler (D) is present in an amount of 100 to 1,000 parts by weight relative to 100 parts by weight of components (A) and (B) combined.

In a preferred embodiment, the antioxidant (E) is present in an amount of 0.01 to 10% by weight of the overall composition.

In this case, (F) a curing promoter may be further incorporated in an amount of 0.05 to 5% by weight of the overall composition.

In a second aspect, the invention provides a method for preparing a white heat-curable silicone/epoxy hybrid resin composition for optoelectronic devices, comprising the steps of:

providing (B) a triazine derived epoxy resin composition by combining (B-1) a triazine derived epoxy resin with (B-2) an acid anhydride in such amounts as to provide an epoxy group equivalent to acid anhydride group equivalent ratio between 0.6 and 2.0, reacting them to form a solid product, and grinding the solid product, mixing (A) a heat-curable silicone resin with the triazine derived epoxy resin composition (B) in a weight ratio of from 5:95 to 95:5, and concurrently mixing them with (C) a white pigment, (D) an inorganic filler excluding the white pigment, and (E) an antioxidant, said antioxidant (E) being a phosphite compound having formula (1).

Another embodiment is a method for preparing a white heat-curable silicone/epoxy hybrid resin composition for optoelectronic devices, comprising the steps of:

providing (B) a triazine derived epoxy resin composition by combining (B-1) a triazine derived epoxy resin with (B-2) an acid anhydride in such amounts as to provide an epoxy group equivalent to acid anhydride group equivalent ratio between 0.6 and 2.0 in the presence of (E) an antioxidant, reacting them to form a solid product, and grinding the solid product, said antioxidant (E) being a phosphite compound having formula (1), mixing the resulting mixture of the triazine derived epoxy resin composition (B) and the antioxidant (E) with (A) a heat-curable silicone resin in such amounts as to provide a weight ratio of component (A) to component (B) in the range from 5:95 to 95:5, and concurrently mixing them with (C) a white pigment, and (D) an inorganic filler.

In the above method, (F) a curing promoter may be further mixed.

In a third aspect, the invention provides a method for preparing a white heat-curable silicone/epoxy hybrid resin composition for optoelectronic devices, comprising the steps of:

providing (B) a triazine derived epoxy resin composition by combining (B-1) a triazine derived epoxy resin with (B-2) an acid anhydride in such amounts as to provide an epoxy group equivalent to acid anhydride group equivalent ratio between 0.6 and 2.0 in the presence of (F) a curing promoter or (F) the curing promoter and (E) an antioxidant, reacting them to form a solid product, and grinding the solid product, said antioxidant (E) being a phosphite compound having formula (1), mixing the resulting mixture of the triazine derived epoxy resin composition (B) and the curing promoter (F) or the curing promoter (F) and the antioxidant (E) with (A) a heat-curable silicone resin in such amounts as to provide a weight ratio of component (A) to component (B) in the range from 5:95 to 95:5, and concurrently mixing them with (C) a white pigment, (D) an inorganic filler, and component (E) if it has not been used in the reaction.

In a fourth aspect, the invention provides a premolded package obtained by molding a white heat-curable silicone/epoxy hybrid resin composition as defined above.

In a fifth aspect, the invention provides an LED device which is constructed using the premolded package of the third aspect.

ADVANTAGEOUS EFFECTS OF INVENTION

The white heat-curable silicone/epoxy hybrid resin composition of the invention is effectively curable and cures into a uniform product having improved strength while maintaining heat resistance and light resistance and experiencing least yellowing over a long period of time. Then premolded packages obtained by molding and curing the composition are very useful in the industry in accommodating high-intensity LEDs and solar cells. The composition is also useful as an underfill material for LED parts.

DESCRIPTION OF EMBODIMENTS

The singular forms "a," "an" and "the" include plural referents unless the context clearly dictates otherwise. The notation (Cn-Cm) means a group containing from n to m carbon atoms per group.

As used herein, the term "average particle size" is determined as weight average value $D_{50}$ or median diameter upon particle size distribution measurement by the laser light diffraction method.

One embodiment of the invention provides a white heat-curable silicone/epoxy hybrid resin composition for optoelectronic devices, comprising as essential components, (A) a heat-curable silicone resin, (B) a triazine derived epoxy resin composition, (C) a white pigment, (D) an inorganic filler excluding the white pigment, and (E) an antioxidant. In this case, (F) a curing promoter may be further added.

A. Heat-Curable Silicone Resin

Component (A) is a heat-curable silicone resin which is preferably a silanol-containing organopolysiloxane, more preferably a silicone polymer having the average compositional formula (2):

$$R^3_a Si(OR^4)_b(OH)_c O_{(4-a-b-c)/2} \qquad (2)$$

wherein $R^3$ is each independently an organic group of 1 to 20 carbon atoms, $R^4$ is each independently an organic group of 1 to 4 carbon atoms, a, b and c are numbers in the range: $0.8 \leq a \leq 1.5$, $0 \leq b \leq 0.3$, $0.001 \leq c \leq 0.5$, and $0.801 \leq a+b+c < 2$.

In formula (2), organic groups of $R^3$ include substituted or unsubstituted monovalent hydrocarbon groups of 1 to 20 carbon atoms, for example, $C_1$-$C_{20}$ alkyl groups, $C_2$-$C_{20}$ alkenyl groups, $C_6$-$C_{20}$ aryl groups, and $C_7$-$C_{20}$ aralkyl groups. Preferred alkyl groups are $C_1$-$C_{10}$ alkyl groups which may be straight, branched or cyclic, such as methyl, ethyl, n-propyl, isopropyl, n-butyl, isobutyl, sec-butyl, tert-butyl, pentyl, hexyl, octyl, cyclopentyl, and cyclohexyl. Preferred alkenyl groups are $C_2$-$C_{10}$ alkenyl groups, such as vinyl, allyl and propenyl. Preferred aryl groups are $C_6$-$C_{10}$ aryl groups, such as phenyl, tolyl, xylyl and naphthyl. Preferred aralkyl groups are $C_7$-$C_{10}$ aralkyl groups, such as benzyl, phenethyl, phenylpropyl and naphthylmethyl. Also included are substituted forms of the foregoing unsubstituted monovalent hydrocarbon groups in which one or more hydrogen atoms are replaced by halogen atoms, cyano groups or the like. Inter alia, $R^3$ is most preferably methyl or phenyl.

In formula (2), $C_1$-$C_4$ organic groups of $R^4$ include alkyl and alkenyl groups. $OR^4$ denotes a terminal group of the siloxane resin other than the silanol group (Si—OH). Exemplary groups of $OR^4$ include methoxy, ethoxy, propoxy, isopropoxy, and butoxy. Inter alia, methoxy and isopropoxy are preferred because the starting reactants are readily available.

In formula (2), a, b and c are numbers satisfying the range: $0.8 \leq a \leq 1.5$, $0 \leq b \leq 0.3$, $0.001 \leq c \leq 0.5$, and $0.801 \leq a+b+c < 2$, and preferably $0.9 \leq a \leq 1.3$, $0.001 \leq b \leq 0.2$, $0.01 \leq c \leq 0.3$, and $0.911 \leq a+b+c \leq 1.8$. If "a" indicative of the content of $R^3$ is less than 0.8, the polysiloxane becomes harder and less crack resistant. If "a" is more than 1.5, a higher content of organic groups enhances hydrophobicity and flexibility, losing the anti-cracking effect and leading to defective appearance due to cissing. If "b" indicative of the content of $OR^4$ is more than 0.3, the polysiloxane tends to have a more content of terminal groups and a lower molecular weight, failing to exert the anti-cracking effect. If "c" indicative of the content of OH is more than 0.5, a more proportion of groups participate in condensation reaction upon heat curing, leading to a higher hardness and less crack resistance. If "c" is less than 0.001, the polysiloxane tends to have a higher melting point and becomes awkward to work. The value of "c" is preferably controlled by tailoring the percent complete condensation of alkoxy groups to the range of 86 to 96%. There is a tendency that the melting point becomes lower at a condensation of less than 86% and excessively high at a condensation of more than 96%.

The organopolysiloxane having average compositional formula (2) as component (A) may also be represented by a combination of Q units [$SiO_{4/2}$] derived from tetrafunctional silane, T units [$R^3SiO_{3/2}$] derived from trifunctional silane, D units [$R^3SiO_{2/2}$] derived from difunctional silane, and M units [$R^3SiO_{1/2}$] derived from monofunctional silane wherein $R^3$ is as defined above. When the organopolysiloxane is expressed by this notation, desirably a molar proportion of T units [$R^3SiO_{3/2}$] is at least 70 mol %, more desirably at least 75 mol %, and even more desirably at least 80 mol %, based on the total moles of entire siloxane units. If the proportion of T units is less than 70 mol %, an overall profile of hardness, adhesion and appearance may be compromised. It is noted that the balance may consist of M, D and Q units, the total content of these units being desirably up to 30 mol %. With respect to the melting point, there is a tendency that the melting point rises with an increasing proportion of Q and T units and lowers with an increasing proportion of D and M units. More preferably the organopolysiloxane consists essentially of at least 70 mol % of T units [$R^3SiO_{3/2}$] and the balance (up to 30 mol %) of D units, as expressed in moles.

The organopolysiloxane as component (A) preferably has a weight average molecular weight of 500 to 7,000, more preferably 1,000 to 6,500, most preferably 1,500 to 6,000, as measured by gel permeation chromatography (GPC) using polystyrene standards.

The organopolysiloxane as component (A) may be prepared through hydrolytic condensation of an organosilane having the general formula (3):

wherein $R^3$ is as defined above, X is a halogen atom such as chlorine or an alkoxy group, typically $C_1$-$C_4$ alkoxy group; and n is 1, 2 or 3.

In formula (3), X is preferably a halogen atom, especially chlorine because organopolysiloxanes in solid form can be prepared.

In formula (3), n is an integer of 1 to 3. When n is equal to 2 or 3, that is, when a plurality of $R^3$ are included, $R^3$ groups may be the same or different. Inter alia, n=1 is preferred because polysiloxanes in solid form can be prepared.

Examples of the silane compound having formula (3) include organotrichlorosilanes and organotrialkoxysilanes such as methyltrichlorosilane, ethyltrichlorosilane, phenyltrichlorosilane, methylvinyldichlorosilane, vinyltrichlorosilane, diphenyldichlorosilane, methyltrimethoxysilane, methyltriethoxysilane, ethyltrimethoxysilane, ethyltriethoxysilane, phenyltrimethoxysilane, vinyltrimethoxysilane, and phenyltriethoxysilane; and diorganodialkoxysilanes such as dimethyldimethoxysilane, dimethyldiethoxysilane, diphenyldimethoxysilane, diphenyldiethoxysilane, methylvinyldimethoxysilane, methylphenyldimethoxysilane, and methylphenyldiethoxysilane. Of these, methyltrichlorosilane is preferably used. It is also effective to use methyltrichlorosilane in combination with phenyltrichlorosilane.

For these silane compounds, a choice of a trichlorosilane or trialkoxysilane and its amount used are preferably determined so as to produce a silanol-bearing organopolysiloxane containing at least 70 mol % of T units.

Any standard technique may be applied when the above-mentioned silane compound having a hydrolyzable group is hydrolyzed and condensed. Preferably the reaction is carried out in the presence of an acid catalyst such as acetic acid, hydrochloric acid or sulfuric acid or a basic catalyst such as sodium hydroxide, potassium hydroxide or tetramethylammonium hydroxide. In an example where a silane having chloro as the hydrolyzable group is used, hydrochloric acid forms as a result of addition of water and serves as the catalyst whereby a hydrolytic condensate having the desired molecular weight may be obtained.

Upon hydrolysis and condensation, the amount of water added is usually 0.9 to 1.6 moles and preferably 1.0 to 1.3 moles per mole of total hydrolyzable groups (e.g., chloro groups) in the silane compound(s). Insofar as the amount of water is in the range of 0.9 to 1.6 moles, the resulting composition is effective to work and cures into a tough product.

Preferably the silane compound having a hydrolyzable group is hydrolyzed in an organic solvent typically selected from alcohols, ketones, esters, cellosolves, and aromatic compounds. Suitable organic solvents include alcohols such as methanol, ethanol, isopropyl alcohol, isobutyl alcohol, n-butanol, and 2-butanol and aromatic compounds such as toluene and xylene. More preferably a mixture of isopropyl alcohol and toluene is used because the resulting composition becomes effectively curable and the cured product becomes tough.

The reaction temperature for hydrolysis and condensation is preferably 10 to 120° C., and more preferably 20 to 100° C. This reaction temperature range ensures to produce a solid hydrolytic condensate without gelation so that it is ready for use in the subsequent step.

One exemplary synthesis process starting with methyltrichlorosilane is described. To a solution of methyltrichlorosilane in toluene, water and isopropyl alcohol are added, whereupon partial hydrolysis takes place at a temperature between −5° C. and 100° C. Then water is added in an amount sufficient to hydrolyze the entire amount of remaining chloro groups whereupon reaction takes place, yielding a solid silicone polymer having a melting point of 76° C.

The desired organopolysiloxane is obtained in this way. The organopolysiloxane typically has a melting point of 50 to 100° C., and preferably 70 to 80° C. If the melting point is below 50° C. or above 100° C., a problem of inefficient kneading arises in the subsequent mixing step.

B. Triazine Derived Epoxy Resin Composition

Component (B) is a triazine derived epoxy resin composition which preferably comprises (B-1) a triazine derived epoxy resin and (B-2) an acid anhydride.

(B-1) Triazine Derived Epoxy Resin

The triazine derived epoxy resin (B-1) used herein includes preferably 1,3,5-triazine nucleus derived epoxy resins. Epoxy resins having isocyanurate rings have better light resistance and electrical insulation, with those having two, and more preferably three epoxy groups on one isocyanurate ring being desirable. Useful examples include tris(2,3-epoxypropyl)isocyanurate, tris(α-methylglycidyl)isocyanurate, and tris(α-methylglycidyl)isocyanurate.

The triazine derived epoxy resins used herein preferably have a softening point of 90 to 125° C. It is noted that the triazine derived epoxy resins used herein exclude hydrogenated triazine rings.

If necessary, an additional epoxy resin other than the foregoing may be used in combination in an amount below a certain level as long as this does not compromise the effect of the invention. Preferably the additional epoxy resin is used in an amount of up to 30 parts, more preferably up to 10 parts by weight relative to 100 parts by weight of the triazine derived epoxy resin. Exemplary epoxy resins include bisphenol A type epoxy resins, bisphenol F type epoxy resins, biphenol type epoxy resins such as 3,3',5,5'-tetramethyl-4,4'-biphenol type epoxy resins and 4,4'-biphenol type epoxy resins, phenol novolac type epoxy resins, cresol novolac type epoxy resins, bisphenol A novolac type epoxy resins, naphthalene diol type epoxy resins, trisphenylol methane type epoxy resins, tetrakisphenylol ethane type epoxy resins, and epoxy resins obtained through hydrogenation of aromatic rings in phenol dicyclopentadiene novolac type epoxy resins and alicyclic epoxy resins. Of these, epoxy resins obtained through hydrogenation of aromatic rings and alicyclic epoxy resins are desirable for heat resistance and UV resistance. It is noted that the additional epoxy resin preferably has a softening point of 70 to 100° C.

(B-2) Acid Anhydride

The acid anhydride (B-2) used herein serves as a curing agent. For light resistance, acid anhydrides which are non-aromatic and free of a carbon-carbon double bond are preferred. Examples include hexahydrophthalic anhydride, methylhexahydrophthalic anhydride, trialkyltetrahydrophthalic anhydrides, and hydrogenated methylnadic anhydride, with methylhexahydrophthalic anhydride being most preferred. These acid anhydride curing agents may be used alone or in admixture.

The triazine derived epoxy resin composition (B) is preferably obtained by combining (B-1) a triazine derived epoxy resin with (B-2) an acid anhydride in such amounts as to provide an epoxy group equivalent to acid anhydride group equivalent ratio between 0.6 and 2.0, more preferably between 1.2 and 1.6, reacting them, preferably in the presence of (E) an antioxidant and/or (F) a curing promoter, to form a solid product, and grinding the solid product. The ground solid product may be used as the resin component. If the ratio is less than 0.6, there may occur under-cure and a loss of reliability. If the ratio is more than 2.0, the unreacted curing agent may be left in the cured composition, detracting from the humidity resistance thereof. It is desirable to use the ground solid product as the curable resin composition because the solid heat-curable resin is easy to work.

In the practice of the invention, components (B-1) and (B-2), preferably components (B-1), (B-2) and (E) are previously heated for reaction at a temperature of 70 to 120° C., preferably 80 to 110° C., for 4 to 20 hours, preferably 6 to 15 hours, or components (B-1), (B-2) and (F), preferably components (B-1), (B-2), (E) and (F) are previously heated for reaction at a temperature of 30 to 80° C., preferably 40 to 60° C., for 10 to 72 hours, preferably 36 to 60 hours, forming a solid reaction product having a softening point of 50 to 100° C., preferably 60 to 90° C. (It is noted that component (E) is an antioxidant and component (F) is a curing promoter.) The solid reaction product is then ground before formulating. A reaction product having a softening point of lower than 50° C. is not solid whereas a reaction product having a softening point of higher than 100° C. may lose fluidity.

One exemplary solid reaction product as component (B) is a compound having the general formula (4).

(4)

Herein R is an acid anhydride residue, and m is a number of 0 to 200.

The solid reaction product as component (B) preferably has a weight average molecular weight of 1,000 to 8,000, more preferably 1,500 to 7,500, most preferably 2,000 to 7,000, as measured by GPC using polystyrene standards.

The heat-curable silicone resin as component (A) and the triazine derived epoxy resin composition as component (B) are compounded in a weight ratio A/B of from 5 parts/95 parts to 95 parts/5 parts by weight. If A/B is less than 5/95 parts by weight, weather resistance is insufficient. If A/B is more than 95/5 parts by weight, strength is poor, and premolded packages become insufficiently reliable. The ratio A/B is more preferably from 10 parts/90 parts to 90 parts/10 parts by weight, and even more preferably from 20 parts/80 parts to 80 parts/20 parts by weight.

C. White Pigment

Component (C) is a white pigment which is blended as a white colorant for enhancing whiteness. In the embodiment wherein the composition is used in forming LED-receiving premolded packages, titanium dioxide is compounded as the white pigment for enhancing whiteness. The titanium dioxide may have a unit cell of rutile or anatase type. Also, the average particle size and shape of titanium dioxide are not limited although a fine powder is desirable for enhancing whiteness in a small amount. Preferably titanium dioxide of rutile type is previously surface treated with hydrated oxides of aluminum, silicon and the like in order to enhance its compatibility with and dispersibility in resins and inorganic fillers, and light resistance.

Although the average particle size and shape of titanium dioxide are not limited, the average particle size is typically in the range of 0.05 to 5.0 μm, preferably 0.1 to 3.0 μm, and more preferably 0.1 to 1.0 μm.

Besides titanium dioxide, other white pigments or colorants such as potassium titanate, zirconium oxide, zinc sulfide, zinc oxide, alumina, and magnesium oxide having an average particle size of 0.05 to 5.0 μm, specifically 0.1 to 3.0 μm may be used alone or in combination with titanium dioxide.

The amount of the white pigment loaded is preferably 3 to 200 parts, more preferably 5 to 150 parts, even more preferably 10 to 120 parts by weight, relative to 100 parts by weight of component (A). Differently stated, the white pigment is desirably present in an amount of 5 to 40% by weight, more desirably 10 to 30% by weight, based on the overall composition. Less than 5 wt % of the white pigment may fail to provide a sufficient level of whiteness whereas more than 40 wt % of the white pigment may detract from flow and be detrimental to molding, causing short filling or voids.

D. Inorganic Filler

Component (D) is an inorganic filler. The filler is selected from those commonly used in epoxy and silicone resin compositions, for example, silicas such as fused silica and crystalline silica, alumina, magnesium oxide, aluminum hydroxide, zinc oxide, silicon nitride, aluminum nitride, and boron nitride, fibrous fillers such as glass fibers and wollastonite, and antimony trioxide, with the proviso that the aforementioned white pigment (C) is excluded. These inorganic fillers may be used alone or in admixture of two or more.

In the practice of the invention, fused silica, and fused spherical silica are preferably used. The particle size and shape of inorganic filler are not particularly limited although an average particle size of 4 to 50 μm is preferred for molding and flow, with a particle size of 7 to 45 μm being more preferred. A higher fluidity is desirably achievable when a powder mixture of fractions having a particle size in a fine range of up to 3 μm, a medium range of 4 to 8 μm, and a coarse range of 10 to 50 μm combined so as to give an average particle size of 4 to 50 μm is used. Particularly when the composition is used to mold a premolded package having a narrow neck or as an underfill material, the inorganic filler used should preferably have an average particle size which is ½ or less of the distance of the narrow neck.

The inorganic filler which has been surface treated with coupling agents such as silane and titanate coupling agents for enhancing the bond strength between the resin and the filler may also be blended. Suitable coupling agents include epoxy-functional alkoxysilanes such as γ-glycidoxypropyltrimethoxysilane, γ-glycidoxypropylmethyldiethoxysilane, and β-(3,4-epoxycyclohexyl)ethyltrimethoxysilane; amino-functional alkoxysilanes such as N-β-(aminoethyl)-γ-aminopropyltrimethoxysilane, γ-aminopropyltriethoxysilane and N-phenyl-γ-aminopropyltrimethoxysilane; and mercapto-functional alkoxysilanes such as γ-mercaptopropyltrimethoxysilane. The amount of the coupling agent used and the surface treatment method are not particularly limited.

The amount of the inorganic filler loaded is preferably 100 to 1,000 parts, more preferably 200 to 900 parts by weight relative to 100 parts by weight of components (A) and (B) combined. Less than 100 pbw of the filler may fail to provide strength whereas more than 1,000 pbw of the filler may lead to failures such as short filling due to a viscosity buildup and delamination within the device due to a lack of flexibility. Differently stated, the inorganic filler is desirably present in an amount of 45 to 90% by weight, and more desirably 50 to 90% by weight, based on the overall composition. Also preferably the total amount of components (C) and (D) is 50 to 95% by weight based on the overall composition.

E. Antioxidant

Component (E) in the white heat-curable silicone/epoxy hybrid resin composition is an antioxidant. A phosphorus-based antioxidant is selected from the aspect of maintaining heat resistance and weather resistance at elevated temperature over a long period of time.

The phosphorus-based antioxidant is a phosphite compound having the general formula (1):

$$P(OR^1)(OR^2)_2 \tag{1}$$

wherein $R^1$ and $R^2$ are each independently an organic group of at least 6 carbon atoms. Preferably $R^1$ and $R^2$ are selected from alkyl groups of 6 to 20 carbon atoms, more specifically 8 to 16 carbon atoms, and aryl groups of 6 to 20 carbon atoms. It is preferred for stability against light that either one or all of $R^1$ and $R^2$ be alkyl groups.

Examples of suitable phosphorus-based antioxidants include trioctyl phosphite, dioctyl monodecyl phosphite, didecyl monooctyl phosphite, tridecyl phosphite, diphenyl monooctyl phosphite, diphenyl monodecyl phosphite, di(p-cresyl)mono(tridecyl)phosphite, tris(2-ethylhexyl)phosphite, and diphenyl mono(tridecyl)phosphite. Inter alia, tridecyl phosphite is most preferred.

The antioxidant is preferably used in an amount of 0.01 to 10%, more preferably 0.03 to 5% by weight based on the overall composition. Outside the range, less amounts of the antioxidant may fail to provide sufficient heat resistance and allow discoloration whereas more amounts of the antioxidant may interfere with the curing step, failing in providing cure and strength.

F. Curing Promoter

In the composition, a curing promoter may be incorporated. The curing promoter used herein as component (F) may be any of well-known curing promoters which are commonly used in epoxy resin compositions. Suitable promoters include, but are not limited to, tertiary amines, imidazoles, organic carboxylic acid salts of amines and imidazoles, metal salts of organic carboxylic acids, metal-organic compound chelates, aromatic sulfonium salts, phosphorus-based catalysts such as organic phosphine compounds and phosphonium compounds, and salts of the foregoing, which may be used alone or in admixture. Of these, the imidazoles and phosphorus-based catalysts are preferred. More preferred are 2-ethyl-4-methylimidazole, methyltributylphosphonium dimethyl phosphate, and quaternary phosphonium bromides.

The curing promoter is preferably used in an amount of 0.05 to 5%, more preferably 0.1 to 2% by weight based on the overall composition. Outside the range, the resulting composition may have an undesired profile of heat resistance and humidity resistance.

G. Other Additives

In the white heat-curable silicone/epoxy hybrid resin composition of the invention, various additives may be compounded if necessary. One typical additive is a curing catalyst for silicone resins.

The curing catalyst which can be used herein is a condensation catalyst for promoting the curing of a heat curable silicone resin. Suitable catalysts include basic compounds such as trimethylbenzylammonium hydroxide, tetramethylammonium hydroxide, n-hexylamine, tributylamine, diazabicycloundecene (DBU), and dicyandiamide; metal-containing compounds such as tetraisopropyl titanate, tetrabutyl titanate, titanium acetylacetonate, aluminum triisobutoxide, aluminum triisopropoxide, zirconium tetra(acetylacetonate), zirconium tetrabutyrate, cobalt octylate, cobalt acetylacetonate, iron acetylacetonate, tin acetylacetonate, dibutyltin octylate, and dibutyltin laurate; and aluminum trisacetylacetonate, aluminum bisethylacetoacetate monoacetylacetonate, and organotitanium chelates such as diisopropoxybis(ethylacetoacetato)titanium and diisopropoxybis(ethylacetoacetato)titanium. Of these, preference is given to zinc octylate, zinc benzoate, zinc p-tert-butylbenzoate, zinc laurate, zinc stearate, aluminum triisopropoxide, and organotitanium chelates. Inter alia, zinc benzoate and organotitanium chelates are most preferred.

In order that the epoxy resin composition and the silicone resin be cured substantially at the same time, the curing catalyst and the curing promoter (F) may be used in combination. In some cases, both the compositions may be commonly cured with either one of these catalysts.

The curing catalyst may preferably be used in an amount of 0.01 to 10 parts, more preferably 0.1 to 6 parts by weight relative to 100 parts by weight of component (A).

In the composition, various other additives may be compounded if necessary. For example, various stress-reducing agents such as thermoplastic resins, thermoplastic elastomers, organic synthetic rubbers and silicones, waxes, silane and titanium based coupling agents, halogen trapping agents, and other additives may be added and compounded for the purpose of improving certain properties of the composition insofar as this does not compromise the effects of the invention.

The silicone/epoxy hybrid resin composition comprising components (A) to (E) as essential components is cured into a product which preferably has a reflectance at 380 to 750 nm of at least 70% at the initial and at least 70% after a thermal degradation test of heating at 180° C. for 24 hours. If the reflectance is less than 70%, LED-receiving optoelectronic cases made of the composition undesirably have a short service life.

When the composition of the invention is used as ordinary semiconductor encapsulants or in sealing of vehicle-mounted modules, the composition is typically loaded with a colorant such as carbon black. Any commercially available carbon blacks may be used although pure carbon blacks substantially free of alkali metals or halogens are desirable.

The composition is prepared by combining a silicone resin, epoxy resin, curing agent, curing catalyst, filler and other additives in a predetermined ratio, mixing the ingredients on a mixer until uniform, melt mixing on a hot roll mill, kneader or extruder, cooling for solidification, and grinding the solid product to a suitable size. The resulting silicone/epoxy hybrid resin composition is ready for use as a molding material.

Since the silicone/epoxy hybrid resin composition thus prepared is effectively moldable and exhibits good heat resistance and light resistance, specifically UV resistance, it is best suited in forming white, blue and UV LED-receiving premolded packages and as package materials for solar cells. Also included are premolded packages obtained by applying the composition onto a metal substrate or organic substrate of the matrix array type having leads and pads formed therein such that only the LED member-mounting portion is left empty, the packages being ready for batch encapsulation. The composition may also be used as ordinary semiconductor encapsulants or in sealing of vehicle-mounted modules.

Figure 1:
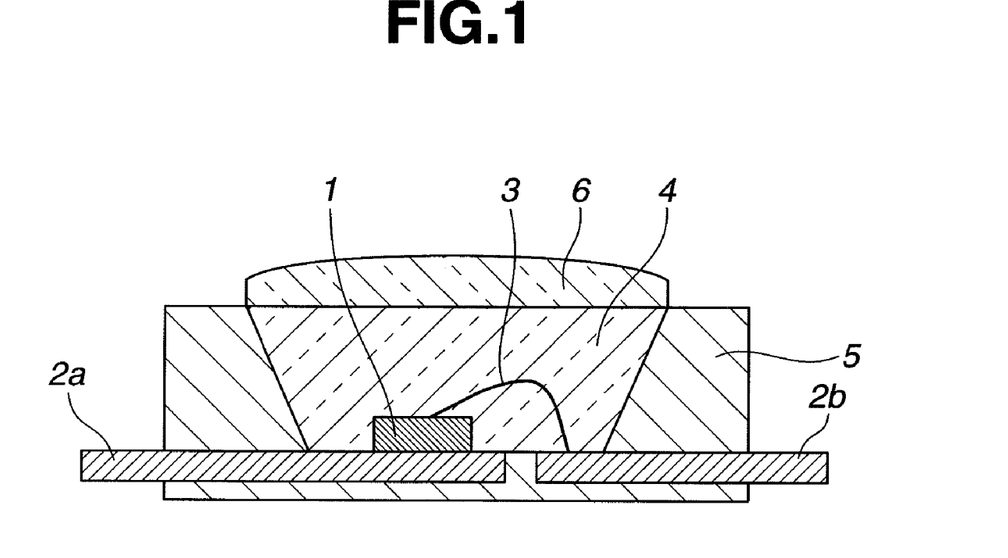
FIG. 1 schematically illustrates an exemplary optoelectronic device in a substrate (in the form of LED reflector) made of the heat-curable silicone/epoxy hybrid resin composition of the invention.

Referring to FIG. 1, an exemplary optoelectronic device is schematically illustrated. An LED reflector is shown as an example of an optoelectronic part made of the heat-curable silicone/epoxy hybrid resin composition of the invention. In FIG. 1, a semiconductor part 1 composed of compound semiconductor is die-bonded to a lead frame 2a (typically Ag- or NiPdAu-plated copper frame) and wire-bonded to another lead frame 2b via a bonding wire 3. These members are embedded in a transparent encapsulant resin 4. The semiconductor part 1 embedded in the encapsulant resin 4 is supported or enclosed by an optoelectronic case 5 which is made of the white heat-curable silicone/epoxy hybrid resin composition in the cured state. The case 5 serves as a white reflector. A lens 6 is disposed on top of the encapsulant resin 4.

Figure 2:
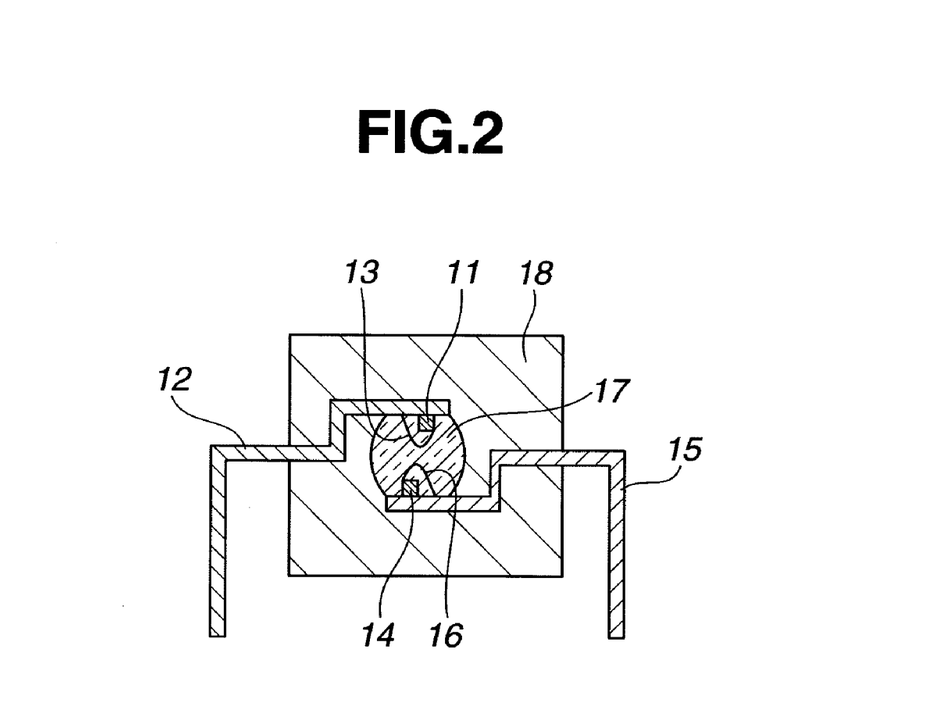
FIG. 2 schematically illustrates an exemplary photocoupler using the heat-curable silicone/epoxy hybrid resin composition of the invention.

FIG. 2 schematically illustrates an exemplary photocoupler comprising semiconductor parts and the heat-curable silicone/epoxy hybrid resin composition of the invention. In FIG. 2, a light-emitting semiconductor part 11 composed of compound semiconductor is die-bonded to a lead frame 12 and wire-bonded to another lead frame (not shown) via a bonding wire 13. A light-receiving semiconductor part 14 is die-bonded to a lead frame 15 and wire-bonded to another lead frame (not shown) via a bonding wire 16. The semiconductor parts 11 and 14 are opposed to each other for optical coupling while a transparent encapsulant resin 17 fills in between the semiconductor parts. The semiconductor parts encapsulated with the encapsulant resin 4 are further encapsulated or enclosed in the silicone/epoxy hybrid resin composition 18 in the cured state.

The most common method of encapsulating or enclosing with the silicone/epoxy hybrid resin composition of the invention is low-pressure transfer molding. The composition is preferably molded at a temperature of 150 to 185° C. for 30 to 180 seconds. This may be followed by post-curing at a temperature of 150 to 185° C. for 2 to 20 hours.

EXAMPLE

Examples of the invention are given below by way of illustration and not by way of limitation. All parts are by weight (pbw). The weight average molecular weight is determined by GPC using polystyrene standards.

The raw materials used in Examples and Comparative Examples are first described.

A. Heat-Curable Silicone Resin

Synthesis Example 1

A 1-L flask was charged with 100 parts of methyltrichlorosilane and 200 parts of toluene. Under ice cooling, a mixture of 8 parts of water and 60 parts of isopropyl alcohol was added dropwise over 5 to 20 hours while maintaining an internal temperature between −5° C. and 0° C. The reaction mixture was then heated and stirred at the reflux temperature for 20 minutes. The reaction mixture was cooled to room temperature, after which 12 parts of water was added dropwise below 30° C. over 30 minutes, followed by 20 minutes of stirring. Further 25 parts of water was added dropwise, after which the mixture was stirred at 40-45° C. for 60 minutes. Thereafter, 200 parts of water was added whereupon the organic layer was separated. The organic layer was washed until neutral. This was followed by azeotropic dehydration, filtration and vacuum stripping, yielding 36.0 parts of a heat-curable silicone resin (A-1) having the following formula (5) as a colorless transparent solid (m.p. 76° C.). The weight average molecular weight was 3,100.

$$(CH_3)_{1.0}Si(OC_3H_7)_{0.07}(OH)_{0.10}O_{1.4} \quad (5)$$

Synthesis Example 2

A 1-L flask was charged with 80 parts of methyltrichlorosilane, 20 parts of tetraethoxysilane, and 200 parts of toluene. Under ice cooling, a mixture of 8 parts of water and 60 parts of isopropyl alcohol was added dropwise over 5 to 20 hours while maintaining an internal temperature between −5° C. and 0° C. The reaction mixture was then heated and stirred at the reflux temperature for 20 minutes. The reaction mixture was cooled to room temperature, after which 12 parts of water was added dropwise below 30° C. over 30 minutes, followed by 20 minutes of stirring. Further 25 parts of water was added dropwise, after which the mixture was stirred at 40-45° C. for 60 minutes. Thereafter, 200 parts of water was added whereupon the organic layer was separated. The organic layer was washed until neutral. This was followed by azeotropic dehydration, filtration and vacuum stripping, yielding 36.0 parts of a heat-curable silicone resin (A-2) having the following formula (6) as a colorless transparent solid (m.p. 76° C.). The weight average molecular weight was 3,000.

$$(CH_3)_{0.5}Si(OC_3H_7)_{0.06}(OH)_{0.15}O_{1.65} \quad (6)$$

B-1. Triazine Derived Epoxy Resin
  Tris(2,3-epoxypropyl)isocyanate (trade name TEPIC-S by Nissan Chemical Industries, Ltd., epoxy equivalent 100, weight average molecular weight 297)
B-2. Acid Anhydride
  Carbon-carbon double bond-free acid anhydride, methylhexahydrophthalic anhydride (trade name Rikacid MH by New Japan Chemical Co., Ltd.)
  Carbon-carbon double bond-bearing acid anhydride, tetrahydrophthalic anhydride (trade name Rikacid TH by New Japan Chemical Co., Ltd.)
C. White Pigment
  Titanium dioxide of rutile type (trade name R-45M by Sakai Chemical Industry Co., Ltd.), average particle size 0.29 μm
D. Inorganic Filler
  Fused spherical silica (trade name MSR-4500TN by Tatsumori K.K.), average particle size 45 μm
E. Antioxidant
  E-1. Tridecyl phosphite (trade name ADK STAB 3010 by Adeka Corp.)
  E-2. Triphenyl phosphine F. Curing Promoter
  Phosphorus-based curing catalyst: methyl-tributyl-phosphonium dimethyl phosphate (trade name PX-4MP by Nippon Chemical Industrial Co., Ltd.)
G. Other Additives
  (i) Condensation curing catalyst
    Curing catalyst for silicone resins: zinc benzoate (Junsei Chemical Co., Ltd.)
  (ii) Parting agent
    Calcium stearate (Wako Pure Chemical Industries, Ltd.)

Synthesis Example 3

Preparation of Epoxy Resin Prepolymer
Reaction of an epoxy resin with an acid anhydride was carried out by combining suitable amounts of ingredients and heating under appropriate conditions as shown in Table 1.

TABLE 1

| Formulation (pbw) | | Pre-reaction product | | |
|---|---|---|---|---|
| | | (1) | (2) | (3) |
| Premixing | TEPIC-S | 45 | 45 | 45 |
| | Rikacid MH | 55 | 55 | |
| | Rikacid TH | | | 55 |
| | Triphenyl phosphite | | 3 | 3 |
| Molar ratio | epoxy/acid anhydride | 1.4 | 1.4 | 1.4 |
| Reaction conditions | | 80° C./10 hr | 80° C./10 hr | 80° C./10 hr |
| Weight average molecular weight | | 3000 | 3100 | 3000 |

Examples 1 to 3 and Comparative Examples 1 to 3

White silicone/epoxy hybrid resin compositions were prepared by combining suitable amounts of ingredients as shown in Table 2, intimately mixing them, and kneading on a hot two-roll mill. These compositions were measured for physical properties by the following tests. The results are shown in Table 2. It is noted that all samples were molded by a transfer molding machine.

Spiral Flow
Using a mold according to EMMI standards, a spiral flow was measured at 175° C. and 6.9 N/mm² for a molding time of 120 seconds.

Melt Viscosity
Using a constant-load orifice type flow tester with a nozzle having a diameter of 1 mm, a viscosity was measured at a temperature of 175° C. and a pressure of 25 kgf.

Flexural Strength
A sample was formed at 175° C. and 6.9 N/mm² for a molding time of 120 seconds using a mold according to EMMI standards.

Reflectance
A disc (cured part) having a diameter of 50 mm and a thickness of 3 mm was molded at 175° C. and 6.9 N/mm² for a molding time of 90 seconds. Immediately after molding, after holding at 180° C. for 24 hours, and after exposure to UV radiation for 24 hours (under a high-pressure mercury lamp of 60 mW/cm having a peak wavelength of 365 nm), the reflectance of the disk at wavelength 450 nm was measured by a spectrophotometer X-Rite 8200 (X-Rite, Inc.).

TABLE 2

| | Composition (pbw) | Example 1 | Example 2 | Example 3 | Comparative Example 1 | Comparative Example 2 | Comparative Example 3 |
|---|---|---|---|---|---|---|---|
| A | Heat-curable silicone resin (A-1) | 25 | 50 | 75 | | 50 | 75 |
| B | Triazine derived epoxy resin: TEPIC-S (B-1) | | | | 45 | | |
| | Acid anhydride: Ricacid MH (B-2) | | | | 55 | | |
| | Pre-reaction product (1) | 75 | | | | | |
| | Pre-reaction product (2) | | 50 | | | 50 | |
| | Pre-reaction product (3) | | | 25 | | | 25 |
| C | White pigment: R-45M | 160 | 160 | 160 | 160 | 160 | 160 |
| D | Inorganic filler: MSR-4500TN | 540 | 540 | 540 | 540 | 540 | 540 |
| E | Antioxidant (E-1) ADK STAB 3010 | 0.025 | 0.01 | 0.025 | | | |
| | (E-2) Triphenyl phosphine | | | | | 0.01 | 0.025 |
| F | Curing promoter: PX-4MP | 1 | | | 1 | 1 | 1 |
| G | Other additive (i) Curing catalyst | 1 | 1 | 1 | 1 | 1 | 1 |
| | (ii) Parting agent | 1 | 1 | 1 | 1 | 1 | 1 |
| Test results | Spiral flow (inch) | 29 | 24 | 19 | 33 | 23 | 20 |
| | Melt viscosity (Pa·s) | 85 | 97 | 112 | 76 | 94 | 109 |
| | Flexural strength (N/mm²) | 71 | 65 | 58 | 78 | 64 | 57 |
| | Reflectance @450 nm (%) Initial | 89 | 90 | 89 | 88 | 86 | 86 |
| | Holding 180° C./24 hr | 88 | 89 | 88 | 79 | 77 | 77 |
| | UV exposure 24 hr | 89 | 89 | 89 | 79 | 80 | 80 |

As seen from Table 2, the while heat-curable silicone/epoxy hybrid resin compositions in Examples 1 to 3 are cured into products which maintain a high light reflectance even after holding at 180° C. for 24 hours or after UV exposure for 24 hours. This proves that semiconductor devices having LED reflectors made of the inventive compositions in the cured state are useful.

Japanese Patent Application No. 2009-201559 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A white heat-curable silicone/epoxy hybrid resin composition for optoelectronic devices, comprising:
(A) a heat-curable silicone resin which has the average compositional formula (2):

$$R^3_a Si(OR^4)_b (OH)_c O_{(4-a-b-c)/2} \quad (2)$$

wherein $R^3$ is each independently an organic group of 1 to 20 carbon atoms, $R^4$ is each independently an organic group of 1 to 4 carbon atoms, a, b and c are numbers in the range: $0.8 \leq a \leq 1.5$, $0 \leq b \leq 0.3$, $0.001 \leq c \leq 0.5$, and $0.801 \leq a+b+c < 2$,
(B) a triazine derived epoxy resin composition,
(C) a white pigment,
(D) an inorganic filler excluding the white pigment, and
(E) an antioxidant, wherein said antioxidant (E) is a phosphite compound having the general formula (1):

$$P(OR^1)(OR^2)_2 \quad (1)$$

wherein $R^1$ and $R^2$ are each independently an organic group of at least 6 carbon atoms, and components (A) and (B) are present in a weight ratio of from 5:95 to 95:5.

2. The composition of claim 1 wherein in formula (1), either one or all of $R^1$ and $R^2$ are alkyl groups of at least 6 carbon atoms.

3. The composition of claim 1 wherein the triazine derived epoxy resin composition (B) comprises (B-1) a triazine derived epoxy resin and (B-2) an acid anhydride.

4. The composition of claim 1 wherein the triazine derived epoxy resin composition (B) is obtained by combining (B-1) a triazine derived epoxy resin with (B-2) an acid anhydride in such amounts as to provide an epoxy group equivalent to acid anhydride group equivalent ratio between 0.6 and 2.0, reacting them to form a solid product, and grinding the solid product.

5. The composition of claim 1 wherein
the white pigment (C) is one or more members selected from the group consisting of titanium dioxide having an average particle size of 0.05 to 5.0 μm, and potassium titanate, zirconium oxide, zinc sulfide, zinc oxide, alumina and magnesium oxide each having an average particle size of 0.1 to 3.0 μm, and
the inorganic filler (D) is one or more members selected from the group consisting of silica, alumina, magnesium oxide, aluminum hydroxide, zinc oxide, silicon nitride, aluminum nitride, and boron nitride each having an average particle size of 4 to 50μm.

6. The composition of claim 1 wherein the white pigment (C) and the inorganic filler (D) are present in a total amount of 50 to 95% by weight of the overall composition, the white pigment (C) is present in an amount of 5 to 40% by weight of the overall composition, and the inorganic filler (D) is present in an amount of 100 to 1,000 parts by weight relative to 100 parts by weight of components (A) and (B) combined.

7. The composition of claim 1 wherein the antioxidant (E) is present in an amount of 0.01 to 10% by weight of the overall composition.

8. The composition of claim 1 wherein (F) a curing promoter is further incorporated in an amount of 0.05 to 5% by weight of the overall composition.

9. A method for preparing a white heat-curable silicone/epoxy hybrid resin composition for optoelectronic devices, comprising the steps of:
providing (B) a triazine derived epoxy resin composition by combining (B-1) a triazine derived epoxy resin with (B-2) an acid anhydride in such amounts as to provide an epoxy group equivalent to acid anhydride group equivalent ratio between 0.6 and 2.0, reacting them to form a solid product, and grinding the solid product,
mixing (A) a heat-curable silicone resin with the triazine derived epoxy resin composition (B) in a weight ratio of from 5:95 to 95:5, and concurrently mixing them with (C) a white pigment, (D) an inorganic filler excluding the white pigment, and (E) an antioxidant, said antioxidant (E) being a phosphite compound having the general formula (1):

$$P(OR^1)(OR^2)_2 \qquad (1)$$

wherein $R^1$ and $R^2$ are each independently an organic group of at least 6 carbon atoms.

10. A method for preparing a white heat-curable silicone/epoxy hybrid resin composition for optoelectronic devices, comprising the steps of:

providing (B) a triazine derived epoxy resin composition by combining (B-1) a triazine derived epoxy resin with (B-2) an acid anhydride in such amounts as to provide an epoxy group equivalent to acid anhydride group equivalent ratio between 0.6 and 2.0 in the presence of (E) an antioxidant, reacting them to form a solid product, and grinding the solid product, said antioxidant (E) being a phosphite compound having the general formula (1):

$$P(OR^1)(OR^2)_2 \qquad (1)$$

wherein $R^1$ and $R^2$ are each independently an organic group of at least 6 carbon atoms, mixing the resulting mixture of the triazine derived epoxy resin composition (B) and the antioxidant (E) with (A) a heat-curable silicone resin in such amounts as to provide a weight ratio of component (A) to component (B) in the range from 5:95 to 95:5, and concurrently mixing them with (C) a white pigment, and (D) an inorganic filler.

11. The method of claim 9 wherein (F) a curing promoter is further mixed.

12. A method for preparing a white heat-curable silicone/epoxy hybrid resin composition for optoelectronic devices, comprising the steps of:

providing (B) a triazine derived epoxy resin composition by combining (B-1) a triazine derived epoxy resin with (B-2) an acid anhydride in such amounts as to provide an epoxy group equivalent to acid anhydride group equivalent ratio between 0.6 and 2.0 in the presence of (F) a curing promoter or (F) the curing promoter and (E) an antioxidant, reacting them to form a solid product, and grinding the solid product, said antioxidant (E) being a phosphite compound having formula (1):

$$P(OR^1)(OR^2)_2 \qquad (1)$$

wherein $R^1$ and $R^2$ are each independently an organic group of at least 6 carbon atoms, mixing the resulting mixture of the triazine derived epoxy resin composition (B) and the curing promoter (F) or the curing promoter (F) and the antioxidant (E) with (A) a heat-curable silicone resin in such amounts as to provide a weight ratio of component (A) to component (B) in the range from 5:95 to 95:5, and concurrently mixing them with (C) a white pigment, (D) an inorganic filler, and component (E) if it has not been used in the reaction.

13. A premolded package obtained by molding a white heat-curable silicone/epoxy hybrid resin composition for optoelectronic devices, comprising (A) a heat-curable silicone resin which has the average compositional formula (2):

$$R^3{}_a Si(OR^4)_b(OH)_c O_{(4-a-b-c)/2} \qquad (2)$$

wherein $R^3$ is each independently an organic group of 1 to 20 carbon atoms, $R^4$ is each independently an organic group of 1 to 4 carbon atoms, a, b and c are numbers in the range: $0.8 \leq a \leq 1.5$, $0 \leq b \leq 0.3$, $0.001 \leq c \leq 0.5$, and $0.801 \leq a+b+c < 2$, (B) a triazine derived epoxy resin composition,
(C) a white pigment,
(D) an inorganic filler excluding the white pigment, and
(E) an antioxidant, wherein
said antioxidant (E) is a phosphite compound having the general formula (1):

$$P(OR^1)(OR^2)_2 \qquad (1)$$

wherein $R^1$ and $R^2$ are each independently an organic group of at least 6 carbon atoms, and components (A) and (B) are present in a weight ratio of from 5:95 to 95:5.

14. A light emitting diode device which is constructed using the premolded package of claim 13.

* * * * *